(12) United States Patent
Wieczorek et al.

(10) Patent No.: US 7,041,583 B2
(45) Date of Patent: May 9, 2006

(54) METHOD OF REMOVING FEATURES USING AN IMPROVED REMOVAL PROCESS IN THE FABRICATION OF A SEMICONDUCTOR DEVICE

(75) Inventors: Karsten Wieczorek, Dresden (DE); Manfred Horstmann, Dresden (DE); Rolf Stephan, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 27 days.

(21) Appl. No.: 10/624,776

(22) Filed: Jul. 22, 2003

(65) Prior Publication Data

US 2004/0121531 A1 Jun. 24, 2004

(30) Foreign Application Priority Data

Oct. 31, 2002 (DE) .............................. 102 50 902

(51) Int. Cl.
*H01L 21/3205* (2006.01)
*H01L 21/336* (2006.01)

(52) U.S. Cl. ...................... 438/585; 438/299; 438/307; 438/595

(58) Field of Classification Search ................ 438/585, 438/595, 299, 301–307, 705
See application file for complete search history.

(56) References Cited

U.S. PATENT DOCUMENTS

| | | | | |
|---|---|---|---|---|
| 4,450,041 A | | 5/1984 | Aklufi | ........................ 156/628 |
| 4,652,334 A | | 3/1987 | Jain et al. | .................... 156/628 |
| 6,121,133 A | * | 9/2000 | Iyer et al. | .................... 438/636 |
| 6,140,244 A | | 10/2000 | Violette | ...................... 438/705 |
| 6,153,534 A | * | 11/2000 | Long et al. | .................. 438/745 |
| 6,344,396 B1 | * | 2/2002 | Ishida et al. | ................. 438/286 |

* cited by examiner

*Primary Examiner*—Thanh Nguyen
(74) *Attorney, Agent, or Firm*—Williams, Morgan & Amerson, P.C.

(57) ABSTRACT

A method for improving the etch behavior of disposable features in the fabrication of a semiconductor device is disclosed. The semiconductor device comprises a bottom anti-reflective coating layer and/or a disposable sidewall spacer which are to be removed in a subsequent etch removal process. The bottom anti-reflective coating layer and/or the disposable sidewall spacer are irradiated by heavy inert ions to alter the structure of the irradiated features and to increase concurrently the etch rate of the employed materials, for example, silicon nitride or silicon reacted nitride.

23 Claims, 5 Drawing Sheets

METHOD OF REMOVING FEATURES USING AN IMPROVED REMOVAL PROCESS IN THE FABRICATION OF A SEMICONDUCTOR DEVICE

BACKGROUND OF THE INVENTION

1. Field of the Invention

The present invention relates to the field of fabrication of integrated circuits, and, more particularly, to a method for improving the etch behavior of semiconductor device features.

2. Description of the Related Art

The fabrication of integrated circuits requires tiny features of precisely controlled shape and size, for example, a gate electrode, to be formed in a layer of material on an appropriate substrate, such as a silicon substrate. With increasing integration density of the integrated circuits, it becomes more and more crucial to reliably and reproducibly create the minimum feature size, also referred to as critical dimension (CD), within a specific layer of material. The tiny features of precisely controlled shape and size are generated by treating the layer of material by means of, for example, etching, wherein a mask layer is formed over the layer of material to define the tiny features in the layer of material. In general, a mask layer may consist of a layer of photoresist being patterned by a photolithography process.

During the photolithography process, the photoresist may be spin-coated onto the wafer substrate and subsequently selectively exposed to deep ultraviolet radiation. Bottom anti-reflective coating (BARC) layers are required to minimize reflections and corresponding stray light exposure during the photolithography process. Without a bottom anti-reflective coating layer, exposure of the highly sensitive photoresist in undesired regions might be caused by light reflected at underlying layers. Therefore, controlling the critical dimensions, i.e., the size and shape of the tiny features, may be more difficult. Thus, bottom anti-reflective coating layers are essential in the fabrication of field effect transistors in Ultra-Large-Scale-Integrated (ULSI) devices. Typically, inorganic materials, such as silicon nitride, are employed to form the bottom anti-reflective coating layer. The bottom anti-reflective coating layer may also act as an etch stop layer in the subsequent etch process, structuring the photoresist layer, the anti-reflective coating layer and the layer of material, to form the tiny regions. After the removal of the residual photoresist layer, the structured anti-reflective coating layer is removed in a further etch process. A silicon nitride removal process typically employs hot phosphoric acid. The etch selectivity of the anti-reflective coating layer to the layer of material, however, may be poor, particularly when the bottom anti-reflective coating layer is formed of silicon nitride and the gate electrode material is doped polysilicon. Pre-doped polysilicon, for example, is used in advanced field effect transistors to form the gate electrode to reduce undesired gate depletion. Doped polysilicon shows a higher etch rate compared to undoped polysilicon. The poor etch selectivity leads to an increased surface roughness and makes controlling of the critical dimension of the feature more difficult, which may affect the device performance or even lower the production yield of devices.

To explain in detail the use of bottom anti-reflective coating layers, according to a typical prior art process sequence, the process flow for forming a gate electrode of a MOS field effect transistor is described with reference to FIGS. 1a–1d, schematically depicting cross-sectional views of a partially formed field effect transistor.

Figure 1A:
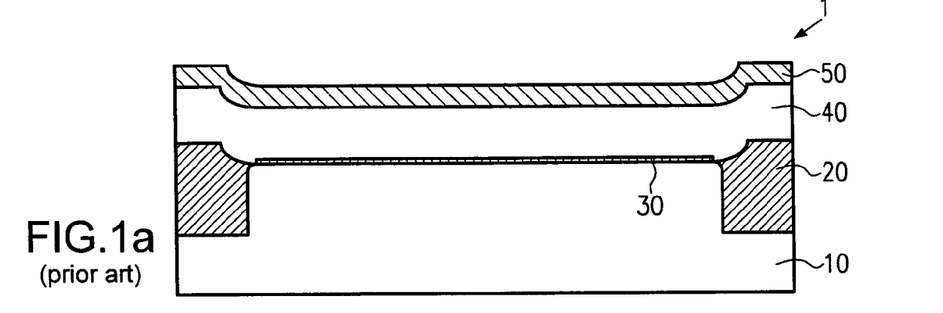
FIGS. 1a–1d schematically depict cross-sectional views of a semiconductor device structure, illustrating a typical process flow of a gate formation process according to the prior art.

FIG. 1a schematically depicts a semiconductor structure 1 comprising a silicon substrate 10 with shallow trench isolation (STI) regions 20, a gate insulation layer 30, a polysilicon layer 40 and a bottom anti-reflective coating layer 50 formed thereon. A typical process flow for forming the semiconductor structure 1 includes well-known isolation and deposition techniques and, thus, a description thereof will be omitted.

Figure 1B:
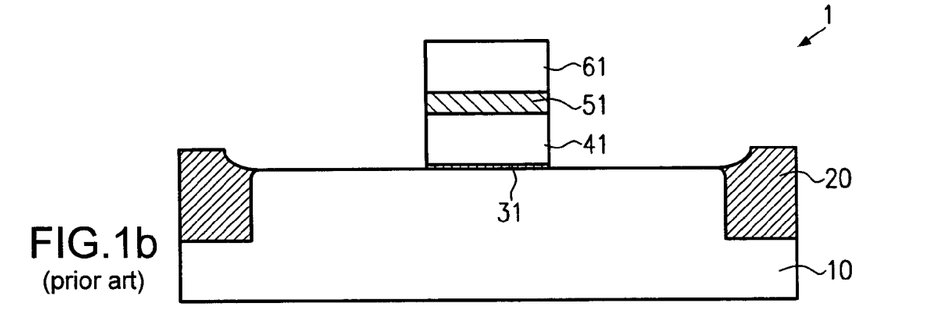

FIG. 1b depicts the semiconductor structure 1 after the formation of a gate electrode 41. The semiconductor structure 1 thus comprises the silicon substrate 10, the shallow trench isolation regions 20, a structured gate insulation layer 31, the gate electrode 41, a structured bottom anti-reflective coating layer 51 and a resist feature 61.

Forming the gate electrode 41 may include a photolithography process, wherein the bottom anti-reflective coating layer 50 reduces the reflection of light at the underlying inter-faces during the exposure of the photoresist. The bottom anti-reflective coating layer 50 may further act as an etch stop layer in the subsequent etch process. The etching of the resist layer and of the polysilicon layer 40 is typically performed in an anisotropic plasma etch process.

Figure 1C:
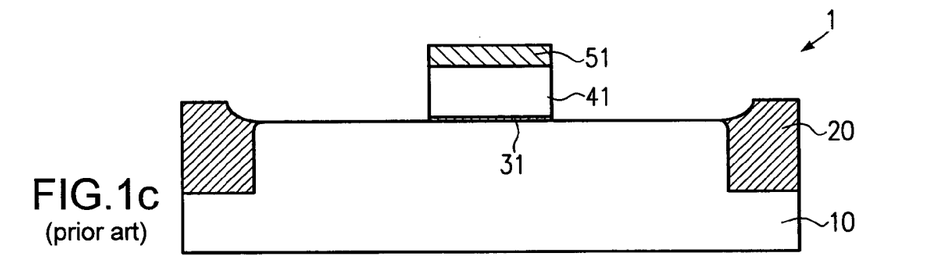

FIG. 1c depicts the semiconductor structure 1 after removal of the photoresist feature 61. The removal of the photoresist is typically performed by the use of an etch process.

Figure 1D:
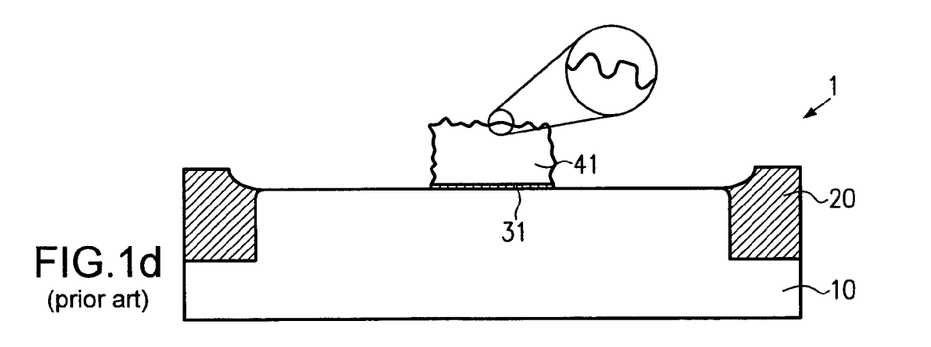

FIG. 1d depicts the semiconductor structure 1 with the completed gate electrode 41. The structured bottom anti-reflective coating layer 51 is removed so that the semiconductor structure 1 comprises the silicon substrate 10, the shallow trench isolation regions 20, the gate insulation layer 31 and the gate electrode 41.

The silicon nitride bottom anti-reflective coating layer 51 is typically removed using hot phosphoric acid ($H_3PO_4$). Silicon nitride layers show relatively low etch rates in phosphoric acid and, hence, a poor etch selectivity to polysilicon. Due to the poor etch selectivity of silicon nitride compared to polysilicon, particularly to pre-doped polysilicon, long etch process times are required to reliably remove the bottom anti-reflective coating layer. The long process time causes undesired etching of the polysilicon device feature, i.e., the gate electrode 41. Thus, the surface roughness of the gate electrode 41 is increased, possibly to an extent that the shape thereof is altered. Moreover, controlling of the dimensions of the gate electrode 41 may be affected, and, consequently, these variations in shape and size may deteriorate the device performance.

Besides the drawback associated with the removal of the bottom anti-reflective coating layer 50, a second drawback in the fabrication of advanced MOS field effect transistor devices is emerging concerning the removal of disposable sidewall spacers. Disposable sidewall spacers are required to reduce the Miller (drain/gate) capacitance caused by the LDD/gate overlap generated in a typical prior art process as described in the following.

The use of sidewall spacers, according to a typical prior art process sequence (without disposable spacers), and the corresponding process flow for forming a MOS field effect transistor, is described with reference to FIGS. 2a–2f, wherein features identical to those illustrated in FIGS. 1a–1c are denoted by the same reference numerals.

Figure 2A:
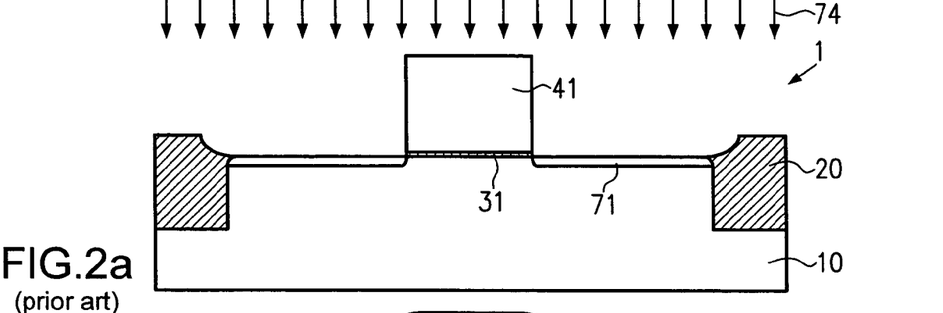
FIGS. 2a–2f schematically depict cross-sectional views of a semiconductor device structure illustrating a typical process flow of the formation of the source/drain regions of a MOS field effect transistor according to the prior art.

FIG. 2a schematically depicts the semiconductor structure 1 during the lightly doped drain (LDD) implantation process 74. The semiconductor structure 1 comprises the silicon substrate 10, the shallow trench isolation regions 20, the patterned gate insulation layer 31, the gate electrode 41 and implanted LDD regions 71.

In the fabrication of MOS field effect transistor devices, source and drain regions of the transistor are formed after the formation of the gate electrode 41 in a self-aligning process. The shallow trench isolation regions 20 and the gate electrode 41 define active regions where the LDD implantation is effective. Depending on the type of ions, for example, phosphorus or boron, N-type or P-type MOS field effect transistors, respectively, may be formed. To provide the source and drain regions with the lightly doped drain (LDD) region 71, an according implantation of doping ions is performed.

Figure 2B:
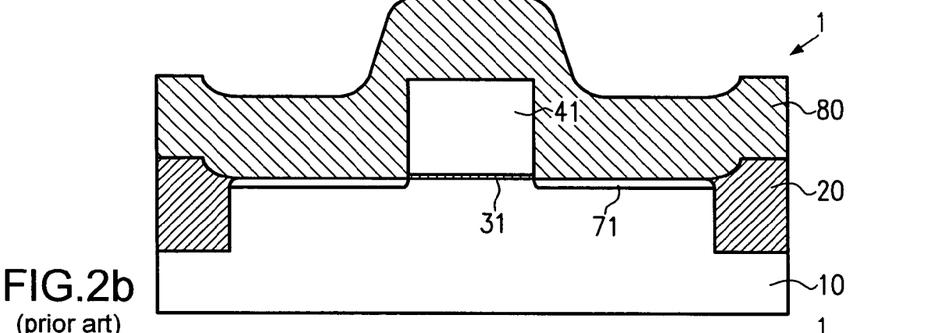
Figure 2C:
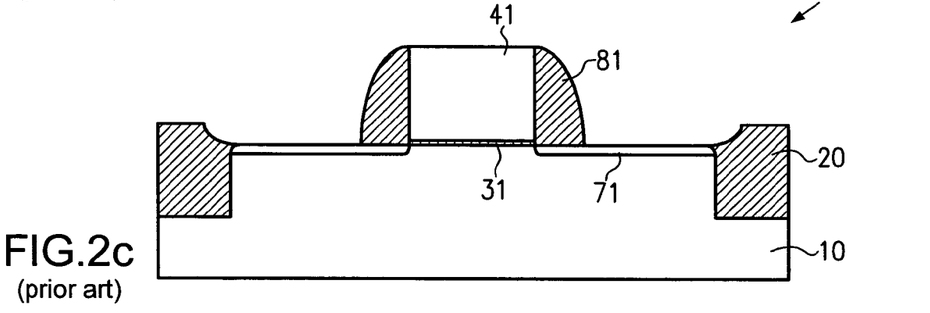

FIG. 2b depicts the semiconductor structure 1 with a deposited silicon oxide or silicon nitride layer 80. The layer 80 may be blanket deposited using a well-known chemical vapor deposition (CVD) process. FIG. 2c depicts the semiconductor structure 1 after the formation of sidewall spacers 81.

Figure 2D:
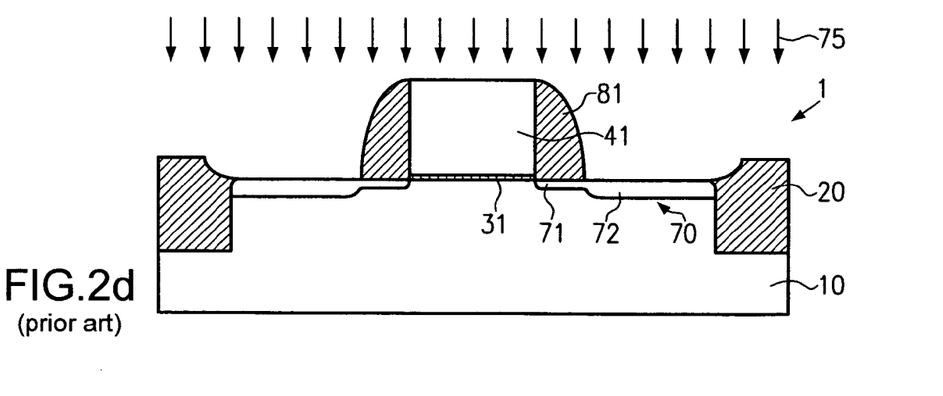

After the formation of the LDD regions 71, the sidewall spacers 81 are formed to protect the extension regions of the LDD regions 71 and to define a region for the subsequent implantation process carried out to form heavily doped deep source/drain regions 72 of a source/drain 70 shown in FIG. 2d. The sidewall spacers 81 are formed in an anisotropic etch process, typically in a plasma etch process.

FIG. 2d depicts the semiconductor structure 1 during the deep source/drain implantation process 75. In addition to the semiconductor structure 1 of FIG. 2c, the implanted deep source/drain regions 72 are shown. The sidewall spacers 81 are employed to prevent the implantation of the ions into the extension regions of LDD regions 71 to generate the desired implantation profile.

Figure 2E:
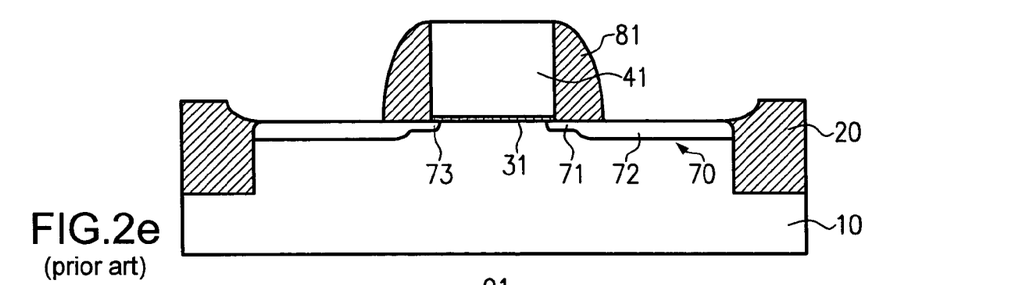

FIG. 2e depicts the semiconductor structure 1 after performing the subsequent thermal annealing process. Thus, the LDD regions 71 comprise LDD/gate overlap portions 73. The annealing is required to incorporate the implanted ions into the semiconductor lattice, i.e., to activate the implanted ions, and to repair the damage of the crystal structure caused by the implanted ions. The annealing of the deep source/drain regions 72 and of the LDD regions 71 is typically carried out in a single annealing process. Annealing, however, also causes diffusion of the ions into the surrounding regions having a lower ion density. Due to the high diffusivity required for the deep source/drain annealing, the LDD ions diffuse also laterally under the gate electrode 41 and accordingly extend the LDD regions 71 under the gate electrode 41 and thus form the LDD/gate overlap portions 73. As a consequence, parasitic capacitances (drain/gate capacitance, known as Miller capacitance) are increased and the device performance may be further deteriorated.

Figure 2F:
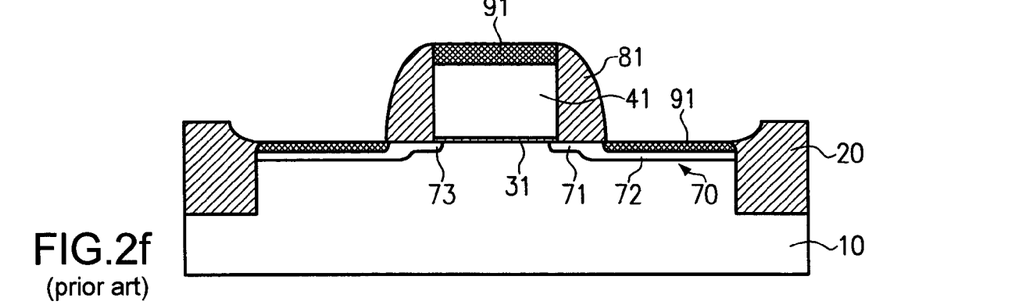

FIG. 2f depicts the semiconductor structure 1 after the formation of silicide regions 91 in the source/drain regions 70 and on the gate electrode 41. The silicide regions 91 are formed in a conventional self-aligned silicide process. The silicide process may, for example, be performed by blanket depositing a metal layer and by a subsequent two-step thermal annealing process, wherein non-reacted excess metal is removed by an appropriate etch process after the first anneal step.

The undesired diffusion of the dopants of the LDD regions 71 under the gate insulation layer 31 can be prevented or at least reduced by varying the sequence of the process steps. An improved dopant concentration profile of the source/drain regions 70, with reduced LDD/gate overlap portions 73, may be achieved when the heavily doped deep source/drain regions 72 are implanted and annealed prior to the implantation of the LDD regions 71. Forming the LDD regions 71 after the annealing of the deep source/drain regions 72 permits the optimization of the required second (LDD) annealing process with respect to the LDD activation and lateral dopant diffusion. Varying the sequence of the process as mentioned, however, requires the removal of the sidewall spacers 81 after the formation of the deep source/drain regions 72. Typically, silicon nitride is employed as a material of the sidewall spacers 81. Due to the poor selectivity of the silicon nitride etch process to the adjacent doped silicon, the removal of the sidewall spacers 81 may lead to a device degradation caused by an incomplete removal of the silicon nitride spacer, thereby affecting subsequent processes, and/or by over-etching, thereby damaging silicon regions of the gate electrode 41 and the source/drain regions 70.

In view of the disadvantages of the conventional removal process of the bottom anti-reflective coating layer 50 and/or of the sidewall spacers 81, it is desirable to provide a method allowing the removal of device features without unduly sacrificing adjacent materials and/or negatively affecting subsequent process steps.

SUMMARY OF THE INVENTION

According to the present invention, a method is provided wherein features of a semiconductor device which have to be removed are irradiated by ions to modify the structure of the material of the features in order to enhance the etch rate thereof and to consequently increase the etch selectivity in the corresponding removal process.

According to one illustrative embodiment of the present invention, a method of forming a semiconductor device feature comprises providing a substrate having a first layer formed thereon and covering the substrate with a second layer of material. Then, ions are implanted into the second layer of material to modify a structure of the material of the second layer, and the second layer of material and the first layer are patterned by photolithography to form the semiconductor device feature in the first layer. The patterned second layer of material is then removed, whereby a selectivity in removing the patterned second layer is increased by the implanting of the ions.

According to another illustrative embodiment of the present invention, a method of forming a semiconductor device structure comprises providing a substrate having formed thereon at least one partially completed semiconductor device, wherein the partially completed semiconductor device comprises at least one feature with sidewalls and sidewall spacers formed thereon. The method further comprises implanting ions into the sidewall spacers, whereby the substrate is tilted with respect to a direction of incidence of the ions. Additionally, the sidewall spacers are removed, whereby a selectivity is increased by the implantation of ions.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention includes the concept of improving the selectivity of an etch process performed to remove a bottom anti-reflective coating layer and sidewall spacers. The selectivity of the etch process is enhanced by increasing the etch rate of the material forming the features to be removed. The etch rate is increased by irradiating ions into the feature. Implanting ions into a solid feature changes the structure of the material of the feature into a more amorphous state, i.e., the short range order in the structure of the material is modified. Particularly heavy ions cause strong damage in the solid structure even at a relatively low dose. In one particular embodiment, inert ions are employed so that the electrical characteristics of the implant regions are minimally affected by the implanted ions. Thus, the term "inert ions" is to be understood as referring to ions having only a minimal influence on the electrical behavior of the materials employed to form the device features, and substantially not acting as a dopant in the semiconductor regions. Thus, for example, argon, xenon, and the like may be used as inert ions. For silicon-based or germanium-based device features, silicon or germanium ions, respectively, may be considered as "inert ions."

With reference to FIGS. 3a–3b and 4a–4h, illustrative embodiments according to the present invention will now be described. In FIGS. 3a–3b and 4a–4h, the same reference signs as in FIGS. 1a–1d and 2a–2f are used to denote similar or identical components and parts.

The embodiments illustrated in FIGS. 3a–3b and 4a–4h relate to a field effect transistor device formed on a silicon substrate and comprising a polysilicon gate device feature. The substrate employed, however, is not limited to a silicon substrate, and any other substrate, for example, a germanium substrate or a silicon on insulator (SOI) substrate, may be used. Moreover, the device feature is not limited to a polysilicon gate, and any other gate or interconnect line feature, for example, a metal gate or a polysilicon interconnect line may be used.

Figure 3A:
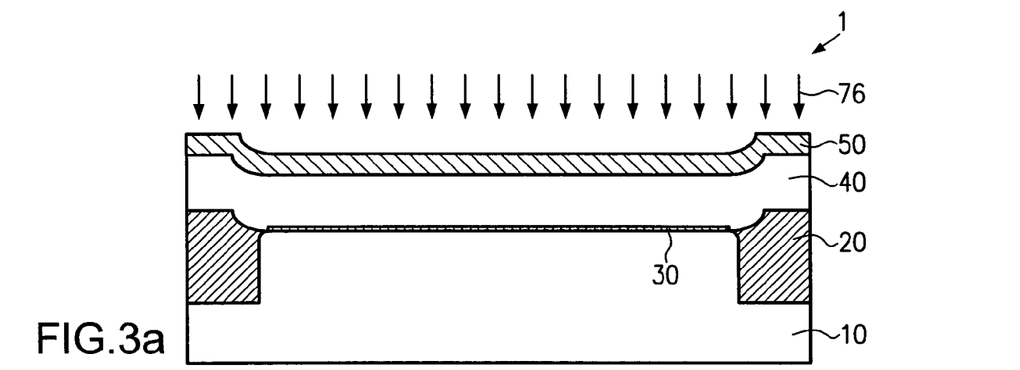
FIGS. 3a–3b schematically depict cross-sectional views of a semiconductor device structure, illustrating the gate formation process in accordance with an illustrative embodiment of the present invention.
Figure 3B:
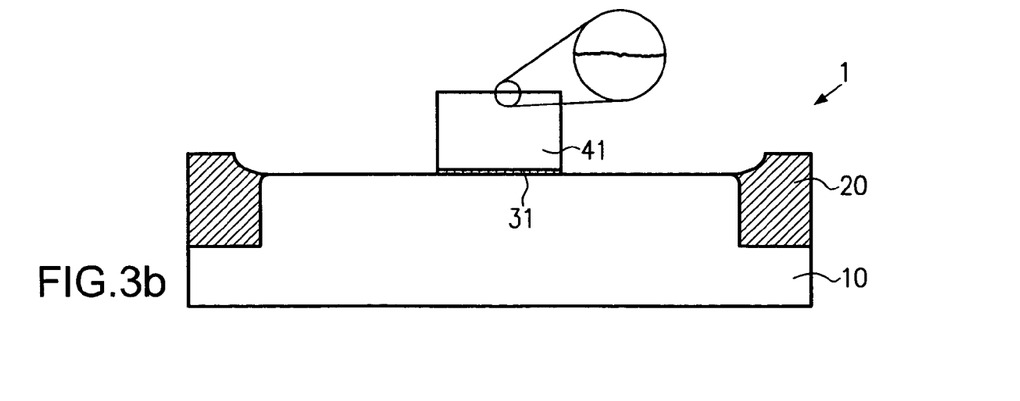

The illustrative embodiments according to the present invention shown in FIGS. 3a–3b employ the same steps as described with respect to FIGS. 1a–1c. The polysilicon gate is formed in the same way except one additional step which is carried out after the deposition of the bottom anti-reflective coating layer 50 and prior to the photolithography process. Thus, FIGS. 3a–3b schematically depict only the additional process step and the improved results achieved by the method according to the present invention.

FIG. 3a schematically depicts a semiconductor device structure 1 comprising a silicon substrate 10, shallow trench isolation regions 20 and a gate insulation layer 30. A semiconductor layer 40 and a bottom anti-reflective coating layer 50 are formed on the semiconductor device structure 1.

After forming the semiconductor device structure 1 as shown in FIG. 3a by well-known deposition techniques, the semiconductor device structure 1 is, contrary to the conventional process flow, subjected to an ion implantation, as indicated by arrows 76. The bottom anti-reflective coating layer 50 comprises an inorganic material, for example, silicon nitride or silicon reacted nitride. The entire anti-reflective coating layer 50 is uniformly irradiated by inert ions to modify the structure of the layer 50. That is, the inert ions may destroy or at least significantly change any short-range order of the material in layer 50, thereby enhancing the diffusivity of particles entering the material. In one embodiment, heavy inert ions, for example, argon and/or xenon, are employed. In another embodiment, ions of the same semiconductor type as the material of the semiconductor of layer 40 and/or the substrate 10 are used to substantially avoid altering the electrical characteristics of the semiconductor regions by ions that may penetrate the semiconductor layer 40 and/or the substrate 10 during implantation. In one embodiment, the implant energy is selected such that the structure of the layer 50 is modified substantially throughout the entire thickness of the layer 50. The ion energies are typically in the range of approximately 30–200 keV and employed ion doses are typically in the range of approximately $1 \times 10^{13}$ to $1 \times 10^{15}$ ions/cm$^2$.

In other embodiments, only a portion of the thickness of the layer 50 is modified, thereby still enhancing the overall etch rate in a subsequent etch process. In one embodiment, the ion energies are selected such that the implanted ions are substantially located in the bottom anti-reflective coating layer 50 close to the interface of the bottom anti-reflective coating layer 50 and the semiconductor layer 40. The ion energies in these embodiments are typically in the range of approximately 5–80 keV.

FIG. 3b schematically depicts the semiconductor device structure 1 after patterning the semiconductor layer 40 and the layer 50, and removing the patterned layer 50. A corresponding process flow may include the steps as described with respect to FIG. 1d. In contrast to the prior art, however, due to the increased etch rate of the layer 50 caused by the irradiation of ions, the etch selectivity of the polysilicon gate electrode 41 relative to the bottom anti-reflective coating layer 50 is increased. Thus, the etch process time is reduced and the gate electrode 41 is less affected by the etching process. Thus, the surface roughness and the control of shape and size of the semiconductor device structure 1, particularly of the gate electrode 41, is improved. Advantageously, due to the improved control of shape and size of the device features in the bottom ant-reflective coating layer removal process, a second feature removal process may be performed on the same semiconductor structure 1 without an undue degradation of the gate electrode 41. As mentioned in the background section of the specification, in advanced field effect transistors, it may be necessary to perform a sidewall spacer removal process to generate source/drain regions with a desired dopant concentration profile.

The selectivity of the etch process to remove the sidewall spacers may also be improved by irradiating ions into the sidewall spacers prior to the etch removal. A corresponding process flow is shown in FIGS. 4a–4h for the semiconductor structure 1 of FIG. 3b.

Figure 4A:
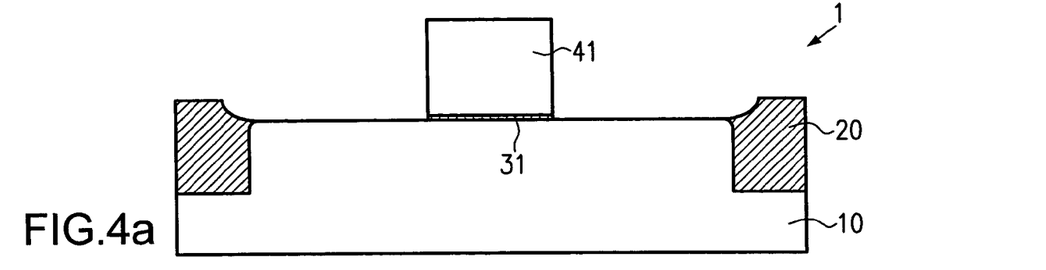
FIGS. 4a–4h schematically depict cross-sectional views of a semiconductor device structure illustrating the formation of the source/drain regions of a MOS field effect transistor in accordance with one illustrative embodiment of the present invention.

FIG. 4a schematically depicts the semiconductor device structure 1 comprising the silicon substrate 10, the shallow trench isolation regions 20, the gate insulation layer 31 and the gate electrode 41 as described with respect to FIG. 3b.

Figure 4B:
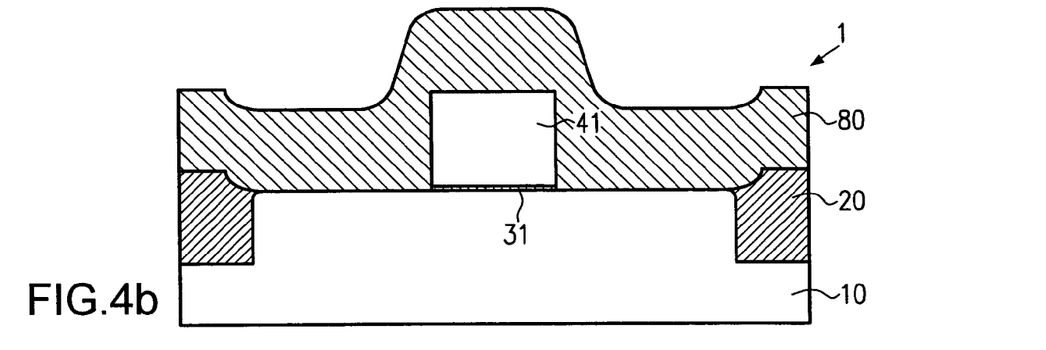

FIG. 4b depicts the semiconductor device structure 1 after the deposition of a silicon nitride layer 80. The silicon nitride layer 80 may be deposited in a conventional chemical vapor deposition (CVD) process, for example, in a low pressure chemical vapor deposition (LPCVD) process.

Figure 4C:
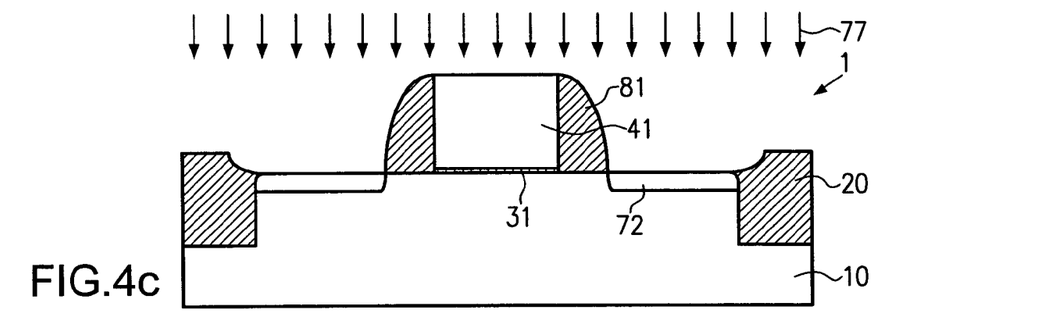

FIG. 4c depicts the semiconductor device structure 1 after formation of sidewall spacers 81 and during an implantation process 77. The sidewall spacers 81 are formed in a conventional anisotropic plasma etch process. Subsequently, the implantation process 77 for forming the deep source/drain regions 72 is performed. Following the implantation, a deep source/drain rapid thermal annealing (RTA) process is carried out at a high temperature prior to the implantation of the LDD regions. Consequently, the deep source/drain region annealing process may not cause diffusion of the LDD ions and a corresponding undesired LDD/gate overlap may be avoided.

The silicon nitride sidewall spacers 81 may be covered with a thin silicon oxide layer (not shown), particularly when the annealing process takes place in an oxygen-containing ambient. The thin silicon oxide layer grows in a slow and self-limiting process by conversion of nitride to oxide.

Figure 4D:
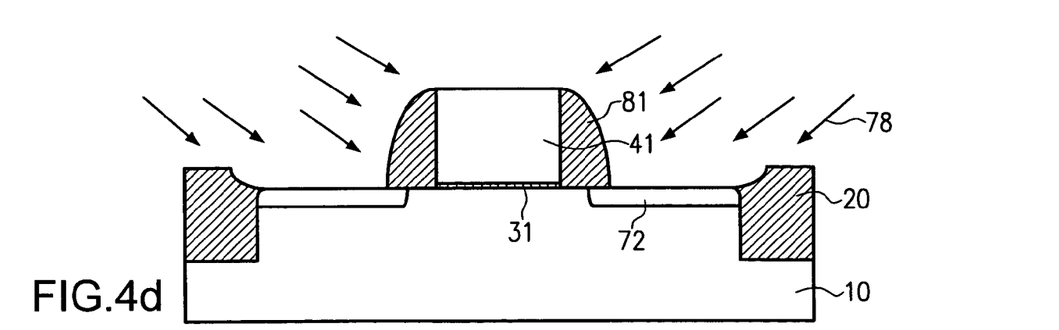

FIG. 4d depicts the semiconductor device structure 1 after the source/drain implantation. Then, a second implantation process 78 is performed wherein the substrate 10 is tilted with respect to the direction of the irradiated ion beam. The tilt angle is chosen to implant a substantial amount of the ions into the sidewall spacers 81. At least a further tilted implantation process 78 is performed to also implant ions into the opposed sidewall spacer 81. The tilt angle is in the range of approximately 10–85 degrees. In one embodiment, the employed ions may be heavy inert ions, for example, xenon and/or argon ions. In other embodiments, alternatively or additionally, semiconductor ions, for example, silicon or germanium, may be employed. By using germanium ions in a silicon device, it is possible to concurrently modify the band structure of the implant regions on the device, for example, to reduce the substrate floating effect in SOI MOSFETs. The appropriate ion energy is in the range of approximately 10–80 keV and the employed ion doses are typically in the range of approximately $1 \times 10^{13}$ to $1 \times 10^{15}$ ions/cm$^2$. The implanted ions cause damage in the structure of the material of the sidewall spacers 81, thereby increasing the etch rate in the subsequent etch removal process. An increased etch rate of the material of the spacers 81 leads to an improved spacer to semiconductor selectivity in the etch process. Thus the sidewall spacers 81 may be removed without or at least reduced device degradation that would otherwise occur, due to the undesired etching of the gate electrode 41 and of the adjacent deep source/drain regions 72.

In addition, the irradiation of ions also improves the etch rate of the silicon oxide layer (not shown) that may cover the sidewall spacers 81. Thus, the silicon oxide layer may be removed during the silicon nitride etch (spacer removal) process or may be removed in a shorter hydrogen fluoride (HF) dip process compared to the prior art HF dip process.

In another embodiment, the ion implantation 110 into the sidewall spacers 81 may be performed prior to the rapid thermal deep source/drain annealing process, or, in yet another embodiment, prior to the formation of the deep source/drain regions 72. Thus, the crystalline structure of the source/drain regions 72 is more intensively amorphized and allows a more effective curing of lattice damage in the subsequent anneal cycle.

Figure 4E:
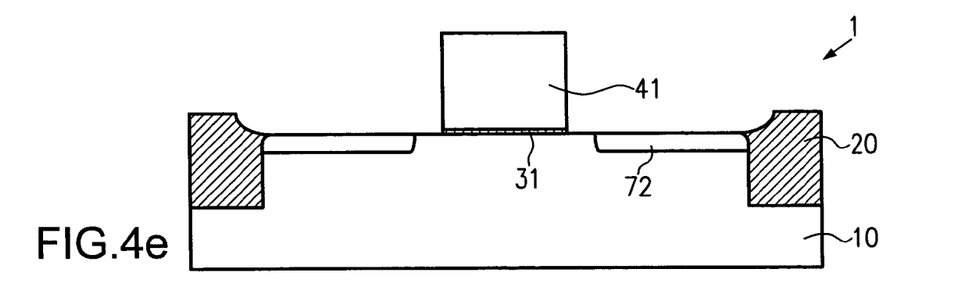
Figure 4F:
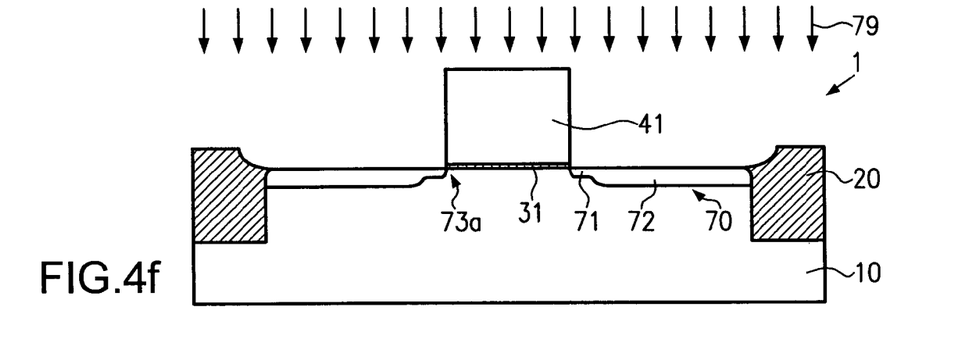

FIG. 4e depicts the semiconductor device structure 1 after annealing and after the removal of the sidewall spacers 81. FIG. 4f depicts the semiconductor device structure 1 during an implantation process 79 for forming LDD regions 71. The LDD implantation is performed in a conventional implantation process. The subsequent rapid thermal annealing cycle, however, may be advantageously optimized for the required LDD activation whereby concurrently a minimal lateral diffusion is effected. The diffusivity may be reduced compared to an annealing process required when the deep source/drain regions 72 and the LDD regions 71 have to be annealed in a single process. Thus, lateral diffusion of the LDD ions under the gate electrode 41, and hence the formation of LDD/gate overlap portions 73, is avoided or at least reduced, as indicated by reference sign 73a. Thereby, the undesired parasitic capacitances are decreased and the device performance is improved.

Figure 4G:
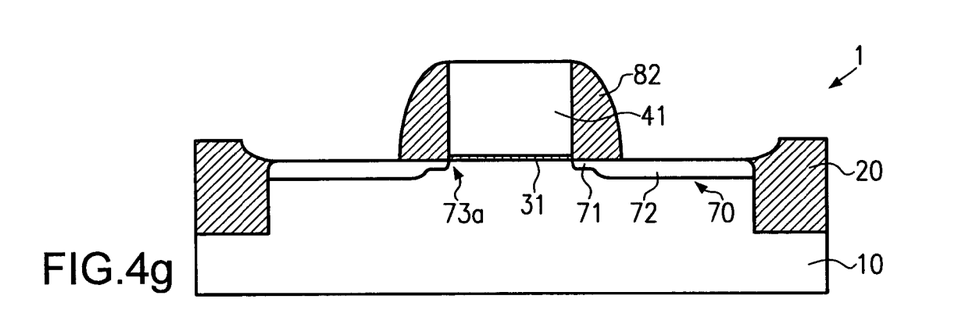
Figure 4H:
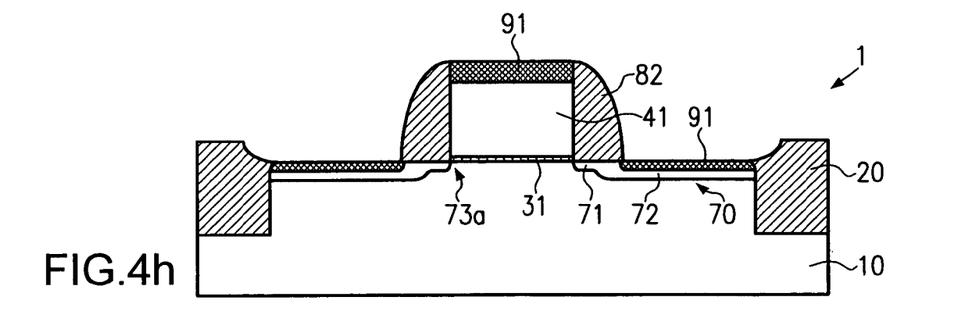

FIG. 4g depicts the semiconductor device structure 1 after sidewall spacers 82 are formed. The newly formed sidewall spacers 82 allow a self-aligned silicide formation. FIG. 4h depicts the semiconductor device structure 1 after the formation of silicide regions 91 on the source/drain regions 70 and on the gate electrode 41. The silicide process may be performed as described with reference to FIG. 2f. The semiconductor device structure 1 shows an improved source/drain dopant concentration profile and, thus, an improved device performance.

The method of improving the etch behavior of the material of sidewall spacers 81 by implantation of ions may also be employed for field effect transistors comprising a thin liner oxide (not shown) on the gate and on the source/drain electrodes. In such a device, the sidewall spacers 81 are consequently formed on the liner oxide. Although, the etch selectivity of silicon nitride to silicon oxide is better than the selectivity of silicon nitride to silicon or polysilicon, controlling of critical dimensions may also be improved in devices comprising a liner oxide.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

The invention claimed is:

1. A method of forming a semiconductor device feature, the method comprising:
   providing a substrate, said substrate having a surface;
   depositing a first layer above said surface of said substrate;
   depositing a second layer of material on said first layer of material;
   implanting ions into said second layer of material to modify a structure of the material of said second layer;
   after depositing said first layer and said second layer of material, patterning said second layer of material and said first layer to form said semiconductor device feature in said first layer; and
   removing said patterned second layer of material, whereby a selectivity in removing said patterned second layer is increased by the implanting of said ions.

2. The method of claim 1, wherein said ions are substantially inert ions.

3. The method of claim 1, wherein said ions are at least one of argon ions, xenon ions, germanium ions and silicon ions.

4. The method of claim 1, wherein the ion dose is in the range of approximately $1 \times 10^{13}$ to $5 \times 10^{15}$ ions/cm$^2$.

5. The method of claim 1, wherein the ion energy is in the range of approximately 5–80 keV.

6. The method of claim 1, wherein said second layer of material is an anti-reflective coating layer.

7. The method of claim 1, wherein said second layer of material is comprised of an inorganic material.

8. The method of claim 1, wherein the material of said second layer of material is one of silicon nitride and silicon reacted nitride.

9. The method of claim 1, wherein a dimension of the device feature in one direction is 100 nm or less.

10. A method, comprising:
    providing a substrate, said substrate having a surface;
    depositing a first layer of material comprised of a gate electrode material above said surface of said substrate;
    depositing a second layer of material comprised of an anti-reflective coating material on said first layer of material;
    after depositing said first layer and said second layer of material, implanting ions into said second layer of material to modify a structure of the material of said second layer of material and thereby increase an etch selectivity of said second layer of material relative to said first layer of material; and
    after implanting said ions, performing at least one etch process to define a gate electrode feature in said first layer of material.

11. The method of claim 10, wherein said ions comprise at least one of argon ions, xenon ions, germanium ions and silicon ions.

12. The method of claim 10, wherein said ions are substantially inert ions.

13. The method of claim 10, wherein an implant energy of an ion implant process performed to implant said ions is selected such that the structure of the material comprising the second layer of material is modified substantially throughout an entire thickness of said second layer of material.

14. The method of claim 10, wherein an implant energy of an ion implant process performed to implant said ions is selected such that said implanted ions are substantially located adjacent an interface between said first layer of material and said second layer of material.

15. The method of claim 10, further comprising performing an etching process to remove a portion of said second layer of material above said gate electrode feature in said first layer of material.

16. A method, comprising:
    providing a substrate, said substrate having a surface;
    depositing a first layer of gate electrode material above said surface of said substrate;
    depositing a second layer of material comprising an anti-reflective coating material on said first layer of gate electrode material;
    after depositing said first layer and said second layer of material, performing an ion implant process to implant ions into said second layer of material to modify a structure of the material of said second layer of material and thereby increase an etch selectivity of said second layer of material relative to said first layer of gate electrode material, wherein an implant energy of said ion implant process is selected such that the structure of the material comprising the second layer of material is modified substantially throughout an entire thickness of said second layer of material; and
    after implanting said ions, performing at least one etch process to define a gate electrode feature in said first layer of material.

17. The method of claim 16, wherein said ions comprise at least one of argon ions, xenon ions, germanium ions and silicon ions.

18. The method of claim 16, wherein said ions are substantially inert ions.

19. The method of claim 16, further comprising performing an etching process to remove a portion of said second layer of material above said gate electrode feature in said first layer of material.

20. A method, comprising:
    providing a substrate, said substrate having a surface;
    depositing a first layer of gate electrode material above said surface of said substrate;

depositing a second layer of material comprising an anti-reflective coating material on said first layer of gate electrode material;

after depositing said first layer and said second layer of material, performing an ion implant process to implant ions into said second layer of material to modify a structure of the material of said second layer of material and thereby increase an etch selectivity of said second layer of material relative to said first layer of gate electrode material, wherein an implant energy of an ion implant process performed to implant said ions is selected such that said implanted ions are substantially located adjacent an interface between said first layer of material and said second layer of material; and after implanting said ions, performing at least one etch process to define a gate electrode feature in said first layer of material.

21. The method of claim 20, wherein said ions comprise at least one of argon ions, xenon ions, germanium ions and silicon ions.

22. The method of claim 20, wherein said ions are substantially inert ions.

23. The method of claim 20, further comprising performing an etching process to remove a portion of said second layer of material above said gate electrode feature in said first layer of material.

* * * * *